(12) United States Patent
Parkinson et al.

(10) Patent No.: US 7,466,584 B1
(45) Date of Patent: Dec. 16, 2008

(54) METHOD AND APPARATUS FOR DRIVING AN ELECTRONIC LOAD

(75) Inventors: Ward Parkinson, Boise, ID (US); John Peters, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 12/006,391

(22) Filed: Jan. 2, 2008

(51) Int. Cl.
*G11C 11/00* (2006.01)

(52) U.S. Cl. .................................... 365/163; 365/148

(58) Field of Classification Search .............. 365/163, 365/148
See application file for complete search history.

(56) References Cited

U.S. PATENT DOCUMENTS

2008/0084735 A1\* 4/2008 Parkinson .................. 365/163

\* cited by examiner

*Primary Examiner*—Vu A Le
(74) *Attorney, Agent, or Firm*—James Wiegand

(57) ABSTRACT

An electronic system includes a control device in combination with an ovonic threshold switch (OTS). The control device, which may be a field effect transistor, a bipolar junction transistor, or a three-terminal ovonic threshold switch, for example, is configured to trigger the OTS. The OTS, a high current-density device, may be configured to drive greater loads than the control device itself would be capable of driving.

25 Claims, 5 Drawing Sheets

METHOD AND APPARATUS FOR DRIVING AN ELECTRONIC LOAD

FIELD OF THE INVENTION

This invention pertains to driving electronic loads with small-geometry devices.

BACKGROUND OF THE INVENTION

Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity may vary by two or more orders of magnitude when the material passes from the amorphous (more resistive) phase to the crystalline (more conductive) phase, and vice versa. In the amorphous state, moreover, the resistivity depends to a marked extent upon the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase.

Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., nucleation of the crystallites occurs and, if the material is kept at the crystallization temperature for a sufficiently long time, the chalcogenide material undergoes a phase change and becomes crystalline. To bring the chalcogenide back to the amorphous state, the temperature of the material is raised above the melting temperature (approximately 600° C.) and then cooled rapidly, i.e. quenched rapidly. From the electrical standpoint, it is possible to reach the crystallization and melting temperatures by causing an adequate current to flow through the phase change memory material, by current flowing through the cell structure and contacts.

Each memory state of a chalcogenide memory material corresponds to a distinct resistance value range, and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information, using cell structures and programming means familiar to those reasonably skilled in the art. The resulting resistance may be achieved, if necessary, by repeated writes and reads in a binary search.

Each memory state can be programmed by providing the current pulse characteristics of the state and each state can be identified, or "read", in a non-destructive fashion by measuring the resistance. Programming among the different states is reversible and the memory devices can be written many times despite limited endurance for write. Between writes, the bits may be read for a virtually unlimited number of read cycles that retrieve the stored data, even after loss of power that may occur periodically between write and read operations ("non-volatile memory" data retention without electrical power).

The variable resistance memory functionality of chalcogenide materials is currently being exploited in the in the phase change memory (PCM) devices that are beginning to appear on the market, also known as Ovonic Universal Memory Ovonic Unified Memory (OUM). Basic principles and operation of PCM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that describe the behavior of chalcogenide materials. The references also describe the structural transformations from the crystalline state to the amorphous state (and vice versa) including a series of partially crystalline states in which the relative proportions of crystalline and amorphous regions may vary during the operation of electrical and optical chalcogenide materials.

Alternative chalcogenide alloy compositions have been investigated in an effort to further optimize the performance characteristics of chalcogenic devices. Chalcogenide materials or alloys may generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. Adjusting the alloy so the material remains in the amorphous phase for this effect is the basis of the Ovonic Threshold Switch (OTS), a feature of chalcogenide materials. The OTS provides reproducible switching at fast switching speeds. Basic principles and operational features of the OTS are presented, for example, in U.S. Pat. Nos. 3,271,591; 5,543,737; 5,694,146; and 5,757, 446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; which are hereby incorporated by reference. Three-terminal OTS devices are disclosed, for example, in U.S. Pats. No. 6,969,867 and 6,967, 344; which are hereby incorporated by reference.

In many electronics applications, and particularly in integrated circuit applications, device size is an important parameter that has a direct impact on the cost/value/function of a device and the circuit of which it is a part. Any circuit or method that reduces the size of a device or devices required to accomplish a task is therefore highly desirable. One application area in which such a size reduction is particularly desirable is in the area of memory arrays, such as OUM memory arrays.

SUMMARY OF THE INVENTION

A system and method in accordance with the principles of the present invention includes a control device in combination with an ovonic threshold switch (OTS) driver. The control device is configured to trigger the OTS driver. When triggered, the OTS is temporarily and reversibly transformed from a high-impedance state to a low-impedance state, thereby lowering the voltage drop across the OTS to its holding voltage Vh.

This reduction in voltage across the driver OTS allows and may yield an increase in voltage across any associated load circuit. For example, if the load circuit itself includes a threshold device, such as a phase change memory (PCM) or an OTS select device (or both), the load may be triggered as well. Once the driver OTS is triggered, the control device may be turned off, allowing all the driver OTS current to flow through an associated load. The control device may take the form of a field effect transistor (FET), a bipolar junction transistor (BJT), or a three-terminal ovonic threshold switch (3T-OTS), for example. OTS devices are high current-density devices. By combining a control device with an OTS driver, an electronic circuit in accordance with the principles of the present invention may controllably switch relatively large currents while occupying significantly less space than would be occupied by an individual transistor capable of switching the same current. Such space-savings are critical in integrated circuit manufacture.

Additionally, because the holding voltage Vh of an OTS is relatively low, using an OTS in accordance with the principles of the present invention provides additional "head room" for circuits that may be operating from relatively low power supply voltages. In accordance with the principles of the present invention, the control device may be limited to a size that is capable of conducting the threshold current of the OTS with margin. That is, the size of the control device may be selected so that it is capable of triggering the OTS and maintaining the OTS in its conductive state with margin, e.g. an extra 20%+ may be included in the design of the control device.

A control device/OTS combination in accordance with the principles of the present invention may be configured to trigger a load that includes a threshold device. The load's threshold device may be a PCM or an OTS, or a combination of PCM and OTS, for example.

In an illustrative embodiment, a load includes a PCM in series with an OTS. The PCM and OTS combination forms a memory cell. A plurality of such cells may be formed in an array, with control device/OTS driver combinations providing access to such memory cells. In particular, a control device/OTS driver circuit in accordance with the principles of the present invention may be situated between a source supply (e.g., a voltage or current pulse source) and a PCM cell, with the triggering of the OTS driver by the control circuit providing a low impedance path to the PCM cell. A second control device/OTS driver combination in accordance with the principles of the present invention may be situated between the PCM cell and a return supply, with the triggering of the second OTS providing a low impedance return path for current flowing through the PCM cell.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of skill in the art. A field effect transistor (FET) may be substituted for a bipolar junction transistor (BJT), an n-channel device may be substituted for a p-channel device, an npn device may be substituted for a pnp device, all with appropriate adjustment of supply voltages, for example. Accordingly, the scope of the invention is defined only by reference to the appended claims.

Figure 1:
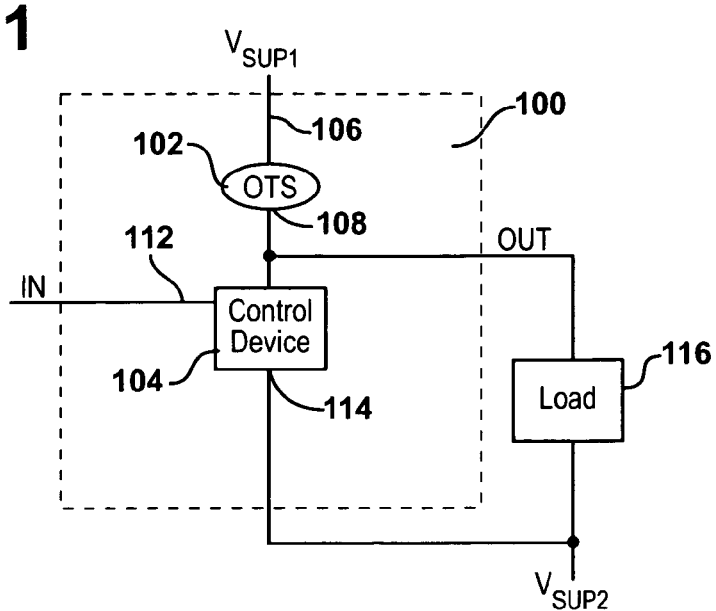
FIG. 1 is a conceptual block diagram of a control device/ OTS combination in accordance with the principles of the present invention.

As illustrated in the conceptual block diagram of FIG. 1, an electronic circuit 100 in accordance with the principles of the present invention includes an OTS 102 and a control device 104, with the control device configured to trigger the OTS. The control device 104 may take the form of a FET, a BJT, or a three-terminal ovonic threshold switch (3T-OTS), for example. The OTS 102 is connected at a first terminal 106 to a supply Vsup1 and at its second terminal 108 to a first terminal 110 of the control device 104. The first terminal 110 of the control device 104 forms an output, labeled OUT. A second terminal 112 of the control device 104 forms an input, labeled IN. A third terminal 114 of the control device 104 is connected to a second supply, Vsup2.

The input terminal 112 exerts control over operation of the control device 104. In an embodiment in which the control device is a FET, the input terminal 112 may be the gate; in one in which the control device 104 is a BJT, the input terminal 112 may be a base (or emitter); and in one in which the control device 104 is a 3T-OTS, the terminal may be referred to simply as a control terminal, for example. Polarities, types of devices, control interconnect, and use of supplies may be substituted in a manner that would be apparent to one of skill in the art. For example, if Vsup1 were at a higher potential than Vsup2 and the control device were of one polarity (e.g., an n-channel FET), the electronic circuit 100 may be reconfigured using a control device of a different polarity (e.g., an p-channel FET) with a corresponding adjustment of supply potentials (e.g., Vsup2 greater than Vsup1). Although the following description will generally be given in terms of FETs, the substitution of different types and polarities of devices and corresponding circuit reconfigurations are within the scope of this invention.

In operation, the output terminal OUT (common with the terminal 110) and Vsup2 terminal (common with the terminal 114) may be connected across a load 116. When triggered, the OTS 102 is transformed from a high-impedance state to a low-impedance state, thereby lowering the voltage drop across the OTS 102 to its holding voltage Vh. The reduction in voltage across the OTS 102 yields an increase in voltage across the load 116.

For example, if the control device is an n-channel FET, the supply voltage Vsup1 is a positive voltage (e.g., 4V) and the supply voltage Vsup2 is 0V, and the voltage on the input IN is 0V, the control device, an n-channel FET, is OFF and presents a high impedance path to the OTS. Thus, the voltage Vsup1 is split across the OTS 102 and the parallel impedance of the control device 104 and Load 116, with very little current flowing from OTS 102 until the Control Device 104 is turned on.

If the input voltage IN is raised to turn the control device on, the control device is no longer in a high-impedance state and the majority of the voltage Vsup1 is imposed across the OTS 102. Assuming the voltage Vsup1 (minus the drop across the control device 104) is greater than the threshold voltage of the OTS 102, the OTS 102 triggers. That is, the OTS enters a conducting state in which it is capable of handling high current-densities and exhibits extremely low dynamic impedance (dV/di). As a result, when the OTS 102 is triggered, terminal 110 (e.g., the drain) of the control device 104 is pulled up approximately to the supply voltage Vsup1, to Vsup1−Vh(OTS)−dV/di(OTS)×I, where I is the current through the OTS device when it is turned on. Since dV/di (OTS 102) may be as low as 500 ohms and the current I less than a milliamp, this dV/di drop may be relatively low compared to Vh. The "top" side of the load 116 is connected to terminal 108 of the OTS and interconnect 110, with the result that more (or substantially all) the voltage Vsup1−V(OTS) is imposed across the load 116 (depending on the impedance of the load relative to the impedance of the triggered OTS). As noted, the dynamic resistance of the OTS is relatively low and, consequently, the voltage across the triggered OTS is approximately Vh(OTs). The voltage across the load 116 may therefore be approximated as: Vsup1−Vh(OTS)−Vsup2.

In an illustrative embodiment, the control device 104 is an n-channel FET with its gate tied to a band-gap regulator and its source to the drain of a second n-channel FET, the source of which is connected to a negative supply, such as Vsup2. In this illustrative embodiment, the gate of the second n-channel FET is controlled by a logic output. By manipulating the gate of the second FET, the first FET is operated as a controllable current source with adequate current to trigger the OTS device. In another illustrative embodiment, the control device may be implemented as a resistor connected to a voltage that is the same as that of one of the OTS terminals, such as 108. The voltage of the resistor is then lowered to trigger the OTS, when desired.

Current control through Load 116 may be achieved by including a current source in series with Vsup1, thereby limiting the current into load 116. In such an illustrative embodiment, if the control device turns off after triggering on OTS 102, the current from the current source driving Vsup1 will flow into Load 116. The current source may be adjustable or a parallel combination of a Read current, Write 1, and/or Write 0 (in an illustrative embodiment in which the load 116 is a memory device). To insure OTS 102 remains on during the function, Control device 104 may be reduced to an Ih(ots) level of current instead of turned off after OTS 102 is triggered.

After triggering the OTS 102, the control device 104 may be turned off, with the OTS 102 left to supply current to the load 116. Consequently, the control device 104 need only be capable of sinking the holding current of the OTS 102, or control device 104 may be reduced to a current of Ih(ots)_ instead of turned off after triggering OTS 102, relieving any maximum impedance requirement on Load 116.

In accordance with the principles of the present invention, in order to reduce the area consumed by the control device 104/OTS 102 combination, the control device 104 may be sized to just handle the hold current of the OTS 102 (with some margin for device variations may be included). In many applications a minimum-geometry control device will be capable of triggering an OTS and, therefore, the "sizing" process will be reduced to simply using a minimum-geometry device. Or, as may typically be the case, even a minimum geometry NFET for many production processes will provide adequate current, or even considerably more current than is necessary to trigger OTS 102. Since the current may be turned on only briefly to accomplish the desired function (triggering on OTS 102), excessive current is acceptable and the smallest possible geometry control device, e.g. NFET, may be used.

After the OTS has provided current to the load 116 as required, the OTS 102 may be turned off by turning off the control device and altering one or both of the supplies (Vsup1, Vsup2) to reduce the current through the OTS to less than the OTS' holding current Ih. If a current source is utilized in series with Vsup1 or Vsup2 (to limit current), the current source may be turned off in order to reduce the current through the OTS to less than Ih.

In accordance with the principles of the present invention, the load 116 may include one or more threshold devices. If the load 116 is a part of the same integrated circuit as the OTS 102, no additional processing would be required to fabricate the OTS in Load 116. Such addition of OTS drivers, with or without OTS in the load, are reasonably integrated into a semiconductor process since the additional thin film process steps are reasonably compatible with semiconductor processes, as is familiar to those reasonably skilled in the art.

Figure 2:
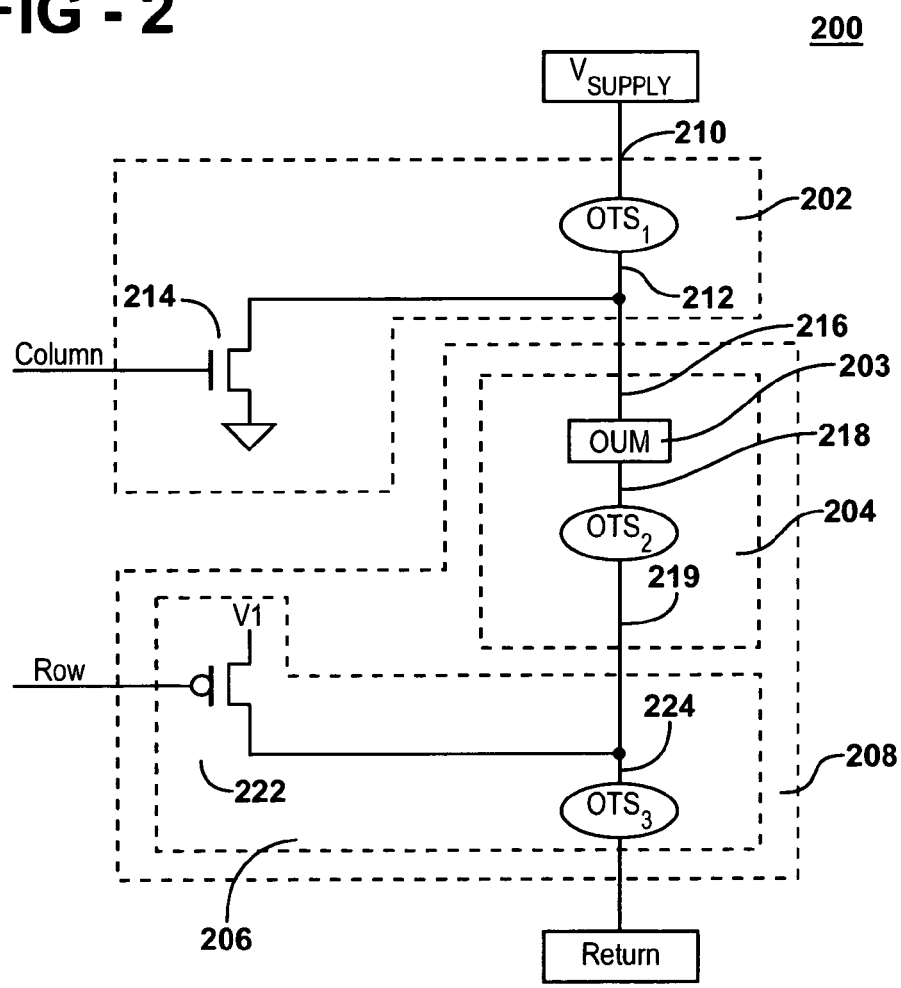
FIG. 2 is a conceptual block diagram of a phase change memory that employs a control device/OTS combination in accordance with the principles of the present invention.

A phase change memory 200 that employs a control device/OTS combination in accordance with the principles of the present invention is depicted in the schematic diagram of FIG. 2. Components, such as sense amplifiers used for reading a phase change memory and current sources employed to write to phase change memories, that may be in series with Vsupply or Return, are not included in this view of the phase change memory 200, but their combination with the circuitry of this illustrative embodiment will be apparent to those of skill in the art.

The memory 200 includes a first control device/OTS driver combination 202, a phase change memory cell 204, and a second control device/OTS combination 206. In this illustrative embodiment, the load 208 (comparable to load 116 of FIG. 1) includes the memory cell 204 and a second control device/OTS combination 206. In this illustrative embodiment, memory cell 204 is in series with two control/OTS combinations—one that turns on in series with positive Vsupply (analogous to a column select device in a memory array) and a second that in series with the Return (analogous to the row select in a memory array). The first 202 and second 206 control device/OTS combinations each may be control device/OTS combinations such as the combination 100 described in the discussion related to FIG. 1.

In this illustrative embodiment, the first control device/OTS combination 202 includes an OTS device OTS1 connected at a first terminal 210 to a positive voltage supply Vsupply and a second terminal 212, also connected to the drain of an n-channel FET 214 in parallel with a load 208. The source of the n-channel FET 214 is connected to a return supply, which may be at 0V potential, for example, and at least adequately negative relative to OTS1 to allow turning it on.

The second terminal 212 of the OTS device OTS1 is also connected to an input terminal 216 of the load, here a phase change cell 204 serving as the memory storage element. The phase change memory (PCM) cell 204 includes a PCM device 203 and an OTS device OTS2 connected in series. The OTS device OTS2 operates as an isolation device, such as is known in the art. No isolation device or other isolation devices (also referred to as access or selection devices), such as a diode or transistor, for example, may be employed in a memory in accordance with the principles of the present invention.

In the illustrative embodiment of FIG. 2, a first terminal 218 of the OTS device OTS2 is connected to the second terminal of the PCM device 203. The second terminal 219 of the OTS device OTS2 is connected to the drain 220 of a p-channel FET 222 and to a first terminal 224 of a third OTS device OTS3. The second terminal of the OTS device OTS3 is connected to a return supply. The source of the p-channel FET 222 is connected to a positive supply voltage, such as Vsupply.

In this illustrative embodiment, the gates of the n-channel 214 and p-channel 222 FETs are respectively connected to column and row select lines, such as respectively from a column decoder and row decoder with appropriate enable timing logic, and which operate, in a manner familiar to those of skill in the art, to select one or more memory cells such as memory cell 204 from a plurality of memory cells in an array or block of an integrated circuit.

A plurality of row and column selection devices, such as the FETs 214 and 222, may be employed to select memory cells in a "crosspoint" manner, whereby only a cell with both its row and column devices activated is accessed. That is, a plurality of cells like 204 may be wired in parallel to 212 and similarly a plurality of other cells like 204 may be wired in parallel to 224. Each cell is different in that it uniquely couples to one of many bit lines 212 and one of many word lines 224. As will be described in greater detail below, the control device/OTS combinations 202 and 206 operate to redistribute the proportion of the voltage difference between Vsupply and Vreturn and, in that manner, access the memory cell 204 for reading or writing to a "1" or "0" (i.e. READING, SETTING, or RESETTING).

With the control input "column" low, the leakage current of the n-channel FET 214 should be less than necessary to trigger the OTS OTS1. With OTS OTS1 off, leakage current into the load should be less than the current necessary to trigger the isolation device in load 204. For example, if the isolation device OTS2 is an OTS (as illustrated), typical leakage currents into OTS1 of less than a few micro-amps, will not be sufficient to trigger the OTS. As a result, the voltage Vsupply is split across the OTS1, the parallel impedance of the control device 214, and the load 204, with very little current flowing from the OTS1 until the control device 214 is turned on.

Because the control device/OTS driver combinations 202 and 206 can sink or source far more current than a transistor of comparable size, a control device/OTS driver combination in accordance with the principles of the present invention may significantly reduce the area within an integrated circuit memory that must be dedicated to circuitry that provides row and/or column access to the load, here shown as one or more memory cells. For example, a control device/OTS combination in accordance with the principles of the present invention may occupy only sixteen lambda squares, while a transistor capable of sinking or sourcing the same current (or adequate load current) occupies 400 squares or more.

Although the illustrative configuration of FIG. 2 includes two control device/OTS driver combinations (i.e., n-channel FET 214/OTS1 and p-channel FET 222/OTS3) for each phase change memory cell 204, as will be described in more detail in the discussion related to FIG. 4, control device/OTS combinations may be shared among a plurality of phase change memory cells.

Figure 3:
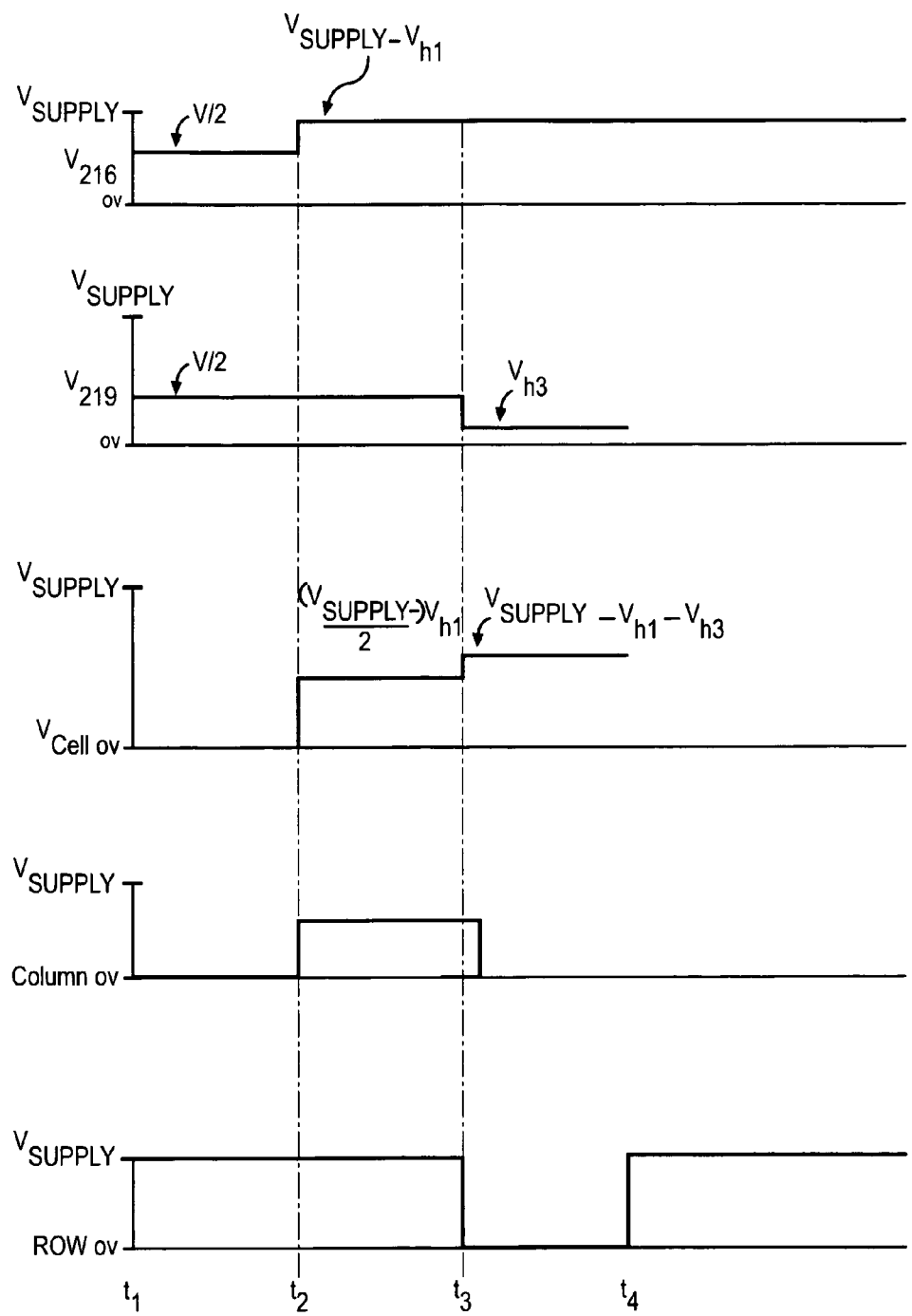
FIG. 3 is a graphical representation of voltages at various locations in the phase change memory of FIG. 2 at different times during an access of the memory.

The timing chart of FIG. 3 may be viewed to better understand operation of the phase change memory circuit of FIG. 2. In the illustrative embodiment of FIG. 2, a control device/OTS driver combination in accordance with the principles of the present invention is configured to controllably provide low impedance connection to Vsupply and Return respectively for the positive and negative terminals of memory cell 204 (that is, memory element 203 in series with isolation device OTS2). In FIG. 3, voltages illustrative of enabling and using the driver embodiment for various points in the example phase change memory circuit of FIG. 2 are plotted versus time.

The "Column" and "Row" plots respectively track the column and row control voltages impressed upon the gates of n-channel 214 and p-channel 222 FETs of FIG. 2. The "A" and "B" plots respectively track the voltage at terminals 216 and 219 of the load, phase change memory cell 204. The "Vcell" plot tracks the total voltage drop impressed across the phase change memory cell 204 (assuming that Vsupply and Return are constant voltages and the load resistance is relative high compared to the dynamic on resistance of OTS1 and OTS2).

At time T1 both the column and row control devices are "off" as indicated by the 0V and Vsupply signal levels at the respective gates of the n-channel and p-channel FETs. In this illustrative embodiment, the prior cycle ended by forcing Vsupply=Vreturn=Vsupply(peak)/2 or V/2, so that 216=219=V/2 at the end of the functional cycle immediately preceding the cycle illustrated in FIG. 3. Terminating a cycle in this fashion (that is, pre-charging Vsupply=Return=V/2) ensures that OTS1 and OTS3 are off at the end of the cycle.

After pre-charging the circuit to V/2, the supply voltages may be brought to their nominal values (e.g. Vsupply=4V and Return=0V) to commence the next cycle. Return may be forced to 0V without turning on OTS3 (assuming the threshold voltage of OTS3 is less than V/2) and Vsupply forced to Vsupply (peak), or V, without turning on OTS1 (assuming the threshold voltage of OTS1 is less than V/2).

Thus, at the start of the cycle, all OTS1 and OTS 3 devices are "OFF" and in a high impedance state, the supply voltage Vsupply is distributed across OTS1, PCM, OTS2, and OTS3, with the pre-charge voltage remaining at the "interior" nodes (that is, those nodes, such as nodes A and B, not directly connected to Vsupply or Return). Given enough time, leakage currents may redistribute the voltages across the devices, but the next cycle, the one illustrated in FIG. 3, begins before such-redistribution may take place and the precharge voltage, such as V/2, may be retained until OTS 1 or OTS3 is turned on. As a result, the voltage at point A (terminal 216 of the phase change memory cell) is ½ Vsupply. Similarly, the voltage at point B (terminal 219 of the phase change memory cell) is ½ Vsupply. The cell voltage, the difference between the voltage at point A and point B, is approximately 0.

In this illustrative embodiment, the threshold voltage for all the OTS devices (i.e., OTS1, OTS2, and OTS3) is set, for example, at more than V/2, such as at ⅔ Vsupply and, consequently, none of the OTS devices will be triggered to conduct at time T1.

At time T2 the Column signal applied to the gate of the n-channel FET is brought high, turning the n-channel FET 214 on. While on, the n-channel FET 214 provides a low impedance path to the return supply (e.g., ground) and the majority of the supply voltage Vsupply falls across the OTS device OTS1. As described in the discussion related to FIG. 1, with the voltage Vsupply impressed across it, the OTS device OTS1 is triggered into its highly conductive state. As previously described, a control device, n-channel FET 214 in this illustrative embodiment, triggers an associated OTS device, OTS1, in order to allow the OTS device to conduct much higher currents than the associated relatively small control device would be capable of handling. As is known in the art, an OTS will remain in its highly conductive state so long as a holding voltage is applied across the device and a holding current is allowed to flow through the device.

In this illustrative embodiment, the n-channel FET maintains a holding current through the OTS device OTS1 and the voltage across the OTS device OTS1 is the device's holding voltage Vh1. With the potential drop across the OTS device OTS1 reduced to Vh1, the voltage at node A is pulled up to Vsupply−Vh1. This voltage (Vsupply−Vh1) is distributed across the devices PCM, OTS2, and OTS3, which are relatively non-conducting. Consequently, the voltage at node B remains at (V/2), and the potential drop across the phase change memory cell 204 is less than V/2, or about Vsupply/2−Vh1).

In this illustrative embodiment, the n-channel FET maintains a holding current through the OTS device OTS1 and the voltage across the OTS device OTS1 is the device's holding voltage Vh1, increased only by a relatively small IR drop (I(transistor 214)×dv/di(OTS1). With the potential drop across the OTS device OTS1 reduced to about Vh1, the voltage at node A is pulled up to Vsupply−Vh1. This voltage (Vsupply−Vh1) is distributed across the devices PCM, OTS2, and OTS3, which are non-conducting (OTS2 and OTS3 remaining untriggered and non-conducting, with voltages less than the Vth of each).

The voltage at node B remains at the pre-charged voltage V/2 (with minimal voltage change due to leakage current into OTS2 and OTS3). The voltage drop across the phase change memory cell at time T2 is the difference between the voltage at nodes A and B: (Vsupply−Vh1)−Vsupply/2, or, Vsupply/2−Vh1 (where Vh1 is the holding voltage of OTS1), resulting in current insufficient to trigger the memory element PCM or the associated OTS, OTS2, because the current flowing into OTS3 is less than the Ith current of either memory cell element (the PCM or OTS2). In general, when triggered, the voltage across the memory element PCM, is a function of its cell state (e.g., amorphous or crystalline). If the PCM element is in the crystalline, low resistance state, the drop is relative low. If the PCM element is in its amorphous, high resistance state, the voltage drop is higher. In this illustrative embodiment, the voltage across the PCM would be (V/2−Vh1)×R(PCM)/(R(PCM)+R(OTS2)). Since this voltage is less than V/2, OTS2 is untriggered, even if PCM 203 is in the crystalline state, since this available voltage is less than Vth(OTS), here for example set at more than V/2. Further, if Ith(PCM) is greater than Ith(OTS), and with the voltage across OTS2 less than Vth(OTS), the PCM will not threshold even if in the amorphous state, since the isolation device OTS2 is unthresholded.

In this illustrative embodiment, the potential drop across either of the PCM 203 or OTS2 is less than the threshold voltage of the OTS device of the memory cell, OTS2. Consequently, although the voltage at node A is "pulled up", the potential across the phase change memory cell 204 is not sufficient to turn on OTS2.

In an array of phase change memories in accordance with the principles of the present invention, activation of the column line in this manner would predispose an entire column of phase change memory cells toward "activation" (that is, a READ, SET, or RESET access). However, an individual cell within the "predisposed" column would be selected only by activation of a row line also connected to the individual cell. The time period between t2 and t3 may be relatively short to minimize the current flowing from NFET 214 into OTS1, but long enough to ensure that the line 212 is charged and enough current flows into OTS1 202 for its turn-on.

At time T3 (plus some overlap margin relative to turn-on of PFET 222) the n-channel FET 214 is turned off (or at least its gate voltage may be reduced so only current necessary to ensure that OTS1 remains "on" is flowing in NFET 214). Turn-off of 214 is indicated by the return of the Column signal (FET 214's gate signal) to zero. At time T3, the p-channel FET 222 is also turned on, as indicated by the Row signal (FET 222's gate signal) dropping from the supply voltage Vsupply to 0V (ground). Although the n-channel FET 214 is turned off, the OTS device OTS1 may remain on, since activation of a row line to select a cell may allow enough current through the load 204 to exceed Ih(OTS1). Otherwise, the gate of NFET 214 may be lowered less to preserve enough current so OTS1 202 remains on. That is, as previously described, the n-channel FET operates as a "trigger" or "starter" device.

With the p-channel FET turned on, OTS device OTS3 is turned on and the voltage at node B is pulled down to Return+Vh3 (or about Vh3 if Return is near 0V), where Vh3 is the holding voltage of the OTS device OTS3. With the node A potential at Vsupply−Vh1 and node B potential at Vh3, the voltage across the phase change memory cell 204 is Vsupply−Vh1−Vh3.

Selection of Vsupply and engineering of Vh1 and Vh3 may ensure that Vsupply−Vh1−Vh3 is greater than Vth(OTS2)+Vth(PCM). For example, Vsupply may be 4V, Vth(OTS) 2V, and Vth(PCM) 1V, and Vh 0.25V. In accordance with the principles of the present invention and with Vsupply-2Vh voltage drop greater than the combined threshold voltages of OTS device OTS2 and PCM 203, the memory cell is selected and may be triggered on by thresholding "on" OTS1 and OTS3.

For a write operation, this voltage (Vsupply-Vh1-Vh3) is greater than the threshold voltage of the OTS device OTS2 plus the threshold voltage of the PCM. For a read operation in this example, the voltage 3.5V (Vsupply-Vh1-Vh3) is greater than the threshold voltage of the OTS device OTS2, 2V, plus a voltage, 1V, that places the PCM in a read voltage regime even if it is reset in the amorphous state. Such a read voltage regime is known in the art and described, for example, in published U.S. Application 2006/0279979 to Lowrey et al, which is hereby incorporated by reference.

As a further example, Vsupply may be in series with a read current source enabled during read that forces the read current through select devices OTS1 and OTS3 once they are triggered on, and thus into selected cell 204. If the current continues charging without a change in slope during read, the cell is in the amorphous state or high resistance state, and charging may be stopped before PCM is thresholded. If the slope changes at a relatively low voltage compared to a bit in the amorphous state, the bit is in a set or low resistance state.

In accordance with the principles of the present invention, for a READ operation, the supply voltage may be increased so that the voltage Vsupply-Vh1-Vh3 is greater than the total of the PCM and OTS2 threshold voltages, in order to turn the OTS2 on, then, once the device OTS2 begins conducting, the supply voltage may be lowered so that the voltage (Vsupply-Vh1-Vh3) is greater than the threshold voltage of the OTS device OTS2 plus a voltage that places the PCM in a read regime, and thus the resistance of the cell state may be detected. Such lowering may be accomplished by placing Vsupply in series with a read current source. Such current source or the supply voltage Vsupply may be a regulated voltage, such as a band-gap regulator, or supplied by a temperature-compensated and voltage compensated current source, for example. Such currents and voltages need not be the same voltage for READ, SET, and RESET operations, and can be designed appropriately of load and isolation devices as will be apparent to one reasonably skilled in the art.

Write set or reset may be accomplished by placing Vsupply in series with a current larger than a read current and adequate to melt the PCM to a temperature adequate to reset the bit. Then, to write the bit to a reset state, the current may turned off rapidly, such as in less than 10 nsec, if the alloy is G2S2T5. Or turn-off (quench) may be even faster if faster alloys are used. To write the bit to a set state, the current amplitude may be the same as for reset, but may be turned off slowly for setting, such as with a linear slope greater than 500 nsec.

After write is accomplished, the Vsupply and Return voltages may be forced to V/2 by pre-charging, and thus turning off the control/driver devices and armed for the next cycle. Such pre-charging may be used advantageously to assist rapid quenching when writing to the reset (higher resistance) state.

Figure 4:
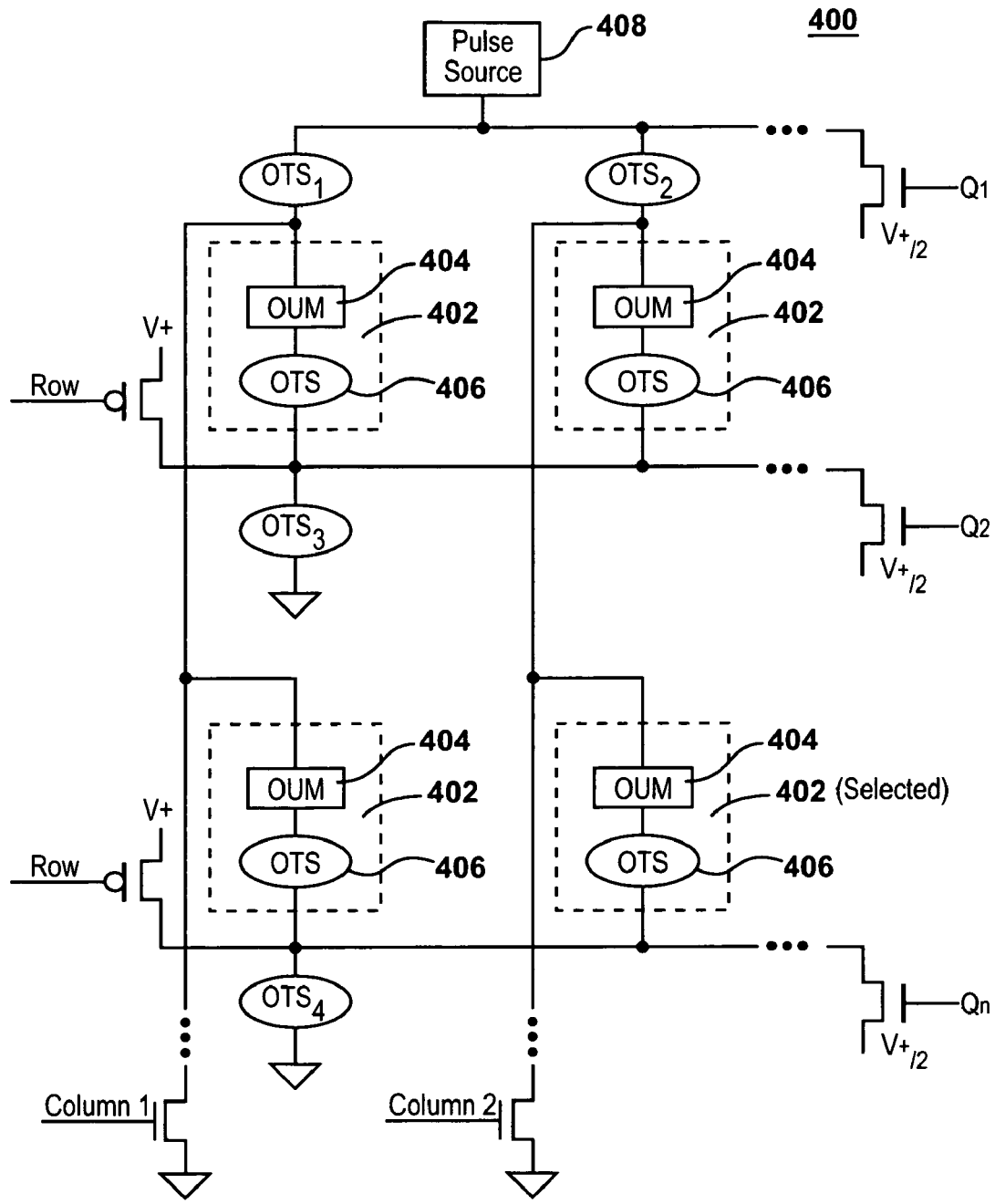
FIG. 4 is a conceptual block diagram of a phase change memory array in accordance with the principles of the present invention.

The conceptual block diagram of FIG. 4, depicts an array 400 of phase change memory cells which are accessed by control device/OTS driver combinations in accordance with the principles of the present invention. The array 400 includes a plurality of phase change memory cells 402 arranged in rows and columns. Each phase change memory cell 402 includes a PCM 404 and an OTS 406.

In this illustrative embodiment a pulse source 408 provides READ, SET, and RESET current pulses, as required, to a selected one of the phase change memory cells 402. As described in the discussion related to FIG. 3, voltages and currents provided by the pulse source 408 may vary according to the requirements of a specific operation. For example, a READ pulse may be current-limited or voltage limited to prevent triggering an PCM, a SET pulse may be of longer duration at a lower current level than a RESET pulse, and a RESET pulse may be a short duration higher current pulse with a fast trailing edge, such as less than 10 nsec if GST 225 is used for the PCM.

Alternately, the SET pulse may be at the same, higher, or lower current level as a RESET pulse, but with a much slower trailing edge. The pulse source 408 may include a temperature-compensated regulated voltage or current source configured to provide appropriate pulses throughout operating environmental ranges.

In this illustrative embodiment, each column includes an OTS selection driver: OTS1, OTS2 . . . ; and associated control device: n-channel FETs, Column1, Column2, etc. enabled by a decoder. Similarly, each row includes an OTS: OTS3, OTS4 . . . ; and associated control device, p-channel FETs: Row1, Row2, etc. enabled by a decoder Rather than having a row selection control device/OTS combination and column selection control device/OTS combination dedicated to each phase change memory cell, a single row selection control device/OTS combination is shared among the phase change memory cells of a row and a single column selection control device/OTS combination is shared among the phase change memory cells of a column. This type of sharing may be spread over an entire memory array or over an individual block within a memory array, for example. Such memory array may be PCM or any other type of memory, using methods described herein that are adapted for other memory types by means familiar to those reasonably skilled in the art.

In operation, an individual phase change memory cell 402 is accessed (i.e. READ, SET, or RESET) by asserting the row and column lines that define the location of the phase change memory cell within the memory array. For example, the phase change cell 402 labeled "SELECTED" may be accessed by asserting the Row2 and Column2 signals. In this illustrative embodiment, n-channel FET Column2 triggers the column OTS OTS2 and p-channel FET Row2 triggers row OTS OTS4. Such triggering may be done simultaneously and for adequate duration to ensure turn-on of the selected OTSn on the selected row and selected column. Or such triggering may be staggered with one turning on first, but preferably with overlap in the turn-on of the control device into the driver OTS device for both the row and column selected.

Triggering devices OTS2 and OTS4 increases the voltage across the phase change memory cell SELECTED (and with full voltage only to that cell) to a level that provides unique access to the SELECTED cell for a READ, Write SET, or Write RESET operation in a manner described in greater detail in the discussion related to FIG. 2.

Optional quench transistors, n-channel FETs Q1, Q2, . . . , Qn in this illustrative embodiment, may be employed to rapidly terminate a pulse provided by the pulse source 408 in order to, for example, properly form a RESET pulse. When activated, the optional quench transistors Q1, Q2, . . . , Qn drain charge that may accumulate on respective row lines within the array 400. Similarly, optional quench transistors (not shown) may be configured to drain excess charge from column lines. The quench transistors may pre-charge the respective lines to a forced voltage, such as ground, or to an intermediate voltage such as V/2, as described in the discussion related to FIGS. 2 and 3. Alternative means of driving one side or terminal of load 402 may be used in combination with the embodiment herein used to drive one or more other terminals of a load, such as the example load 402 in FIG. 4.

Control device/OTS driver combinations in accordance with the principles of the present invention may be employed within a memory in accordance with the principles of the present invention that employs a hierarchical architecture in which blocks of memory are distributed in an array. In an illustrative embodiment, each block of memory and each bit within the block may be accessed through row and column address buffers and decoders, and multiple bits may be accessed by selecting multiple columns, rows, and/or blocks in parallel using the controller/OTS driver embodiments herein described.

Information (data or control code, for example) targeted for writing to memory cells within the array may be stored within data buffers then written to the cells in a manner described in greater detail below. Sense amplifiers may be employed to read information from memory cells within the array and to then store the information in data buffers for presentation "off-memory."

Decoded addresses, in combination with signals such as READ, SET, and RESET, may be employed to route the appropriate current source to a selected memory cell. In accordance with the principles of the present invention, control device/OTS driver combinations are employed to select individual memory cells within the array for READ, SET, or RESET operations.

Figure 5:
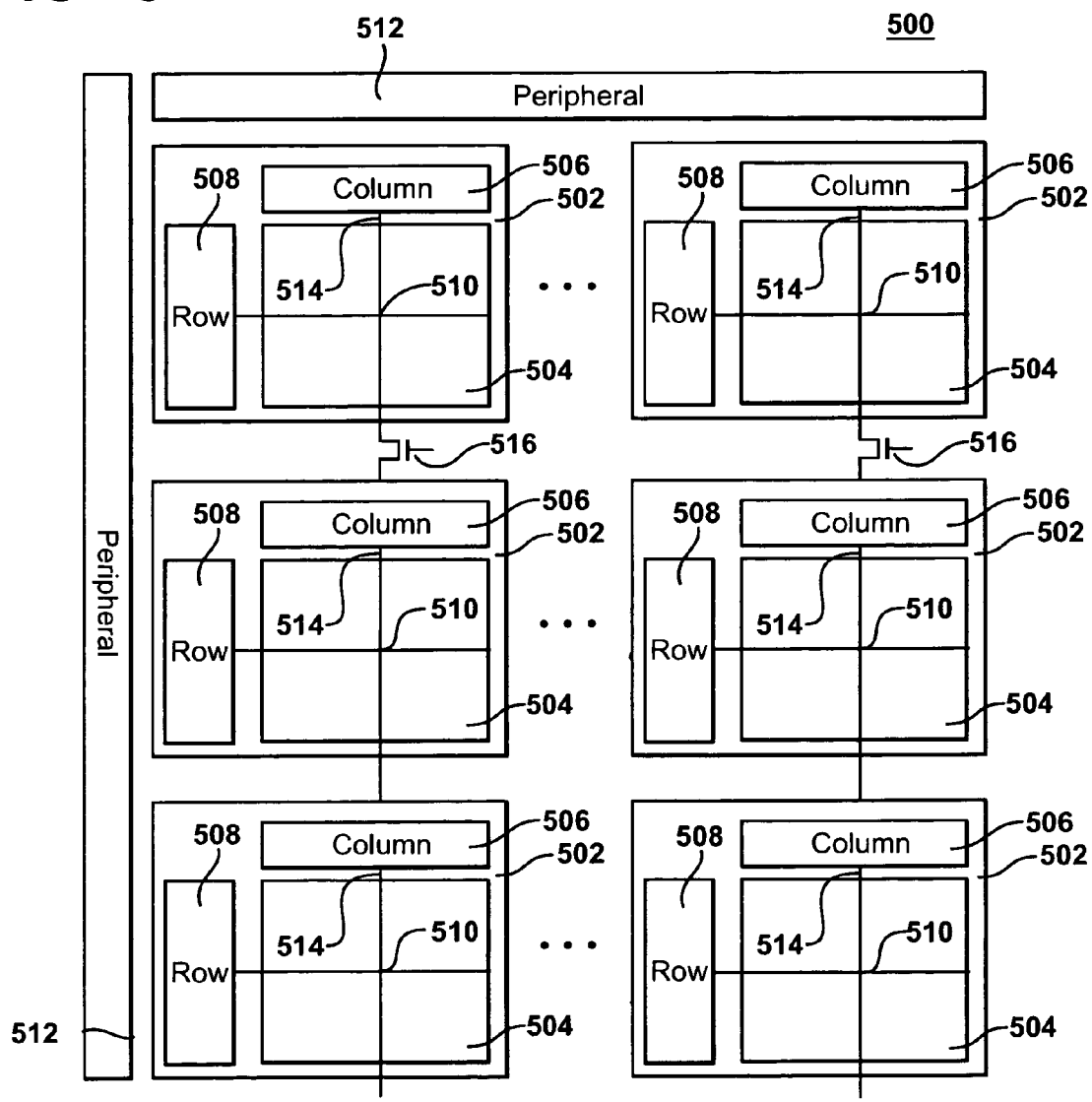
FIG. 5 is a conceptual block diagram of a hierarchical embodiment of a phase change memory in accordance with the principles of the present invention.

In the conceptual block diagram of FIG. 5, a memory 500 is organized in an 8×8 array of 64 memory blocks 502. Each block includes an array of memory cells 504 and peripheral circuitry that includes column 506, and row 508 access circuitry that provide access to individual memory cells 510 within each block 502. Peripheral array circuitry 512 includes row and column decoders and drivers, data and address buffers, sense amplifiers and current sources. The peripheral array circuitry 512 provides top-level decoding for access to the memory blocks 502, and switches/enables the appropriate read- or write-buffers, sense amplifiers, and current sources into a selected memory block 502.

Within each block of memory, ADDRESS DECODE, READ, SET, and RESET signals are used to determine which bit to access and which operation to perform on the accessed bit. In this illustrative embodiment, the memory employs different current/voltage sources for each operation, and, therefore, it predetermines not just whether the bit is to be read from or written to, but, additionally, if it is being written to, whether a SET or RESET is to be performed.

In this illustrative embodiment each of the memory blocks 502 includes a row control device/OTS combination dedicated to each row within the memory block 502 and a column control device/OTS combination dedicated to each column within the memory block 502. Subsets of this combination may be employed with other addressing and selection means.

The phase change electronic device(s) and control/OTS driver embodiment described in the discussion related to the previous figures may be employed to particular advantage in a wide variety of systems. The schematic diagram of FIG. 6 will be employed to illustrate the devices' use in a few such systems. The schematic diagram of FIG. 6 includes many components and devices, some of which will be used for specific embodiments of a system in accordance with the principles of the present invention and others not. In other embodiments, other similar systems, components and devices may be employed. In general, the system includes logic circuitry configured to operate along with phase change memory. The logic circuitry may be discrete, programmable, application-specific, or in the form of a microprocessor, for example. And the embodiments herein may also be employed within the chips or connected to such circuitry.

Figure 6:
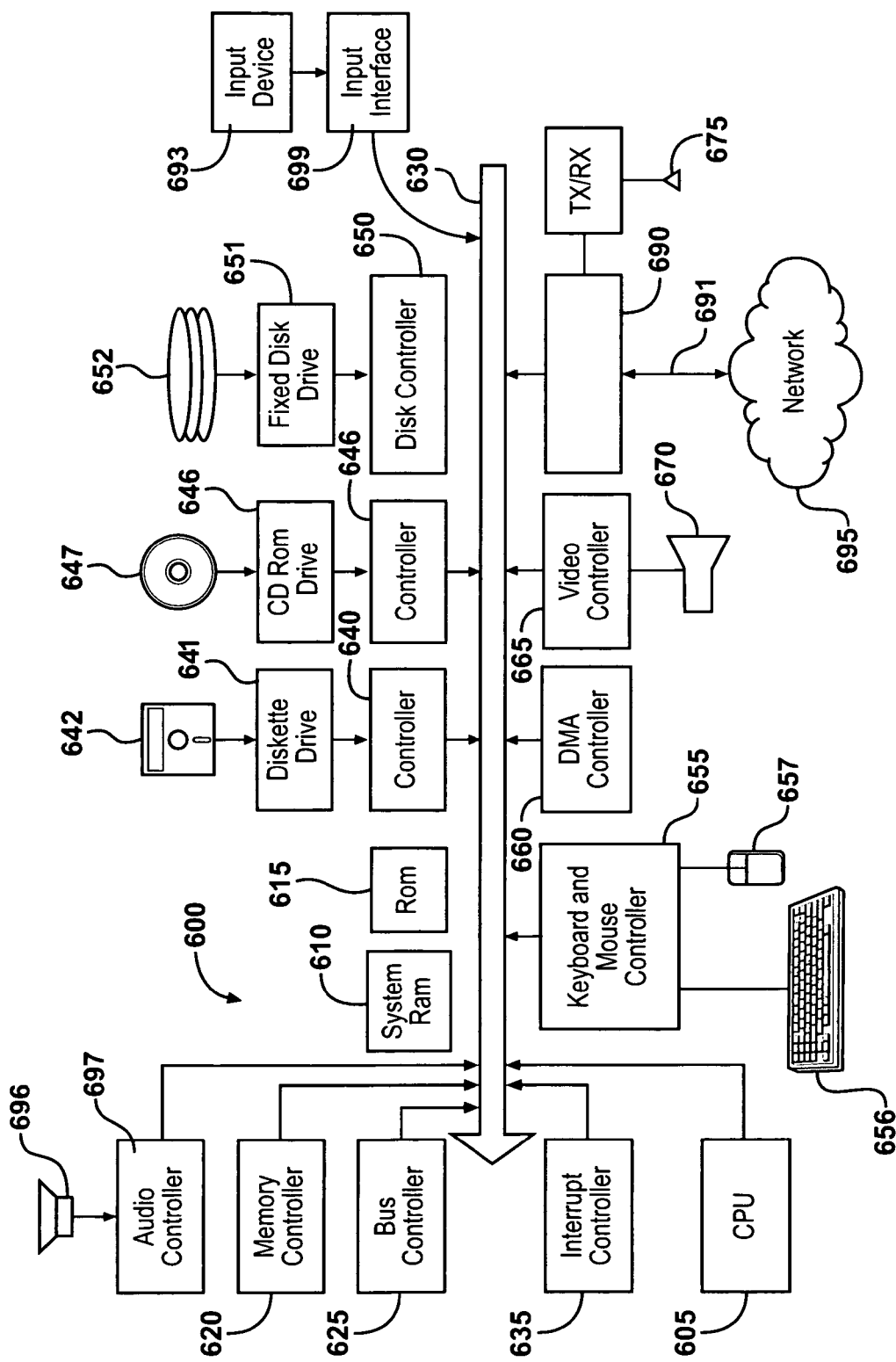
FIG. 6 is a conceptual block diagram of an electronic device in accordance with the principles of the present invention which incorporates a phase change memory in accordance with the principles of the present invention.

The exemplary system of FIG. 6 is for descriptive purposes only. Although the description may refer to terms commonly used in describing particular computer, communications, tracking, and entertainment systems, the description and concepts equally apply to other systems, including systems having architectures dissimilar to that illustrated in FIG. 6. The electronic system 600, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 6 may employ a control device/OTS driver within the components, or within a phase change memory or chalcogenide electronic device, such as a chalcogenide-based nonvolatile memory or threshold switch, for example, that are embedded within the components.

In an illustrative embodiment, the system 600 may include a central processing unit (CPU) 605, which may be implemented with some or all of a microprocessor, a random access memory (RAM) 610 for temporary storage of information, and a read only memory (ROM) 615 for permanent storage of information. A memory controller 620 is provided for controlling RAM 610. In accordance with the principles of the present invention, all of, or any portion of, any of the memory elements (e.g. RAM or ROM) may be implemented using the control device/OTS driver embodiment described herein, either as chalcogenide-based nonvolatile memory, or with other types of memory or components.

An electronic system 600 in accordance with the principles of the present invention may be a microprocessor that operates as a CPU 605, in combination with embedded chalcogenide-based electronic control device/OTS driver used with or without nonvolatile memory that operates as RAM 610 and/or ROM 615, or as a portion thereof. In this illustrative example, the microprocessor and control device/OTS combination may be standalone, or may operate with other components, such as those of FIG. 6 yet-to-be described.

In implementations within the scope of the invention, a bus 630 interconnects the components of the system 600. A bus controller 625 is provided for controlling bus 630. An interrupt controller 635 may or may not be used for receiving and processing various interrupt signals from the system components. Such components as the bus 630, bus controller 625, and interrupt controller 635 may be employed in a large-scale implementation of a system in accordance with the principles of the present invention, such as that of a standalone computer, a router, a portable computer, or a data storage system, for example.

Mass storage may be provided by diskette 642, CD ROM 647, or hard drive 652. Such mass storage may utilize the embodiments described herein. Data and software may be exchanged with the system 600 via removable media such as diskette 642 and CD ROM 647. Diskette 642 is insertable into diskette drive 641 which is, in turn, connected to bus 630 by a controller 640. Similarly, CD ROM 647 is insertable into CD ROM drive 646 which is, in turn, connected to bus 630 by controller 645. Such components may utilize the control device/OTS herein to drive loads within or off the chip. Hard disc 652 is part of a fixed disc drive 651 which is connected to bus 630 by controller 650. Although conventional terms for storage devices (e.g., diskette) are being employed in this description of a system in accordance with the principles of the present invention, any or all of the components or storage devices may be implemented using chalcogenide-based control device/ots drivers in accordance with the principles of the present invention. Removable storage may be provided by a nonvolatile storage component, such as a thumb drive, that employs a chalcogenide-based control device/OTS driver with or without nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 640, 645, and 650, for example.

User input to the system 600 may be provided by any of a number of devices. For example, a keyboard 656 and mouse 657 are connected to bus 630 by controller 655. An audio transducer 696, which may act as both a microphone and a speaker, is connected to bus 630 by audio controller 697, as illustrated. Other input devices, such as a pen and/or tabloid may be connected to bus 630 and an appropriate controller and software, as required, for use as input devices. DMA controller 660 is provided for performing direct memory access to RAM 610, which, as previously described, may be implemented in whole or part using chalcogenide-based control device/OTS drivers with or without nonvolatile memory devices in accordance with the principles of the present invention. A visual display is generated by video controller 665 which controls display 670. The display 670 may be of any size or technology appropriate for a given application.

In a cellular telephone or portable entertainment system embodiment, for example, the display 670 may include one or more relatively small (e.g. on the order of a few inches per side) LCD displays. In a large-scale data storage system, the display may implemented as large-scale multi-screen, liquid crystal displays (LCDs), or organic light emitting diodes (OLEDs), including quantum dot OLEDs, for example. Any such components or devices may use control device/OTS drivers with or without nonvolatile memory devices in accordance with the principles of the present invention.

The system 600 may also include a communications adaptor 690 which allows the system to be interconnected to a local area network (LAN) or a wide area network (WAN), schematically illustrated by bus 691 and network 695. An input interface 699 operates in conjunction with an input device 693 to permit a user to send information, whether command and control, data, or other types of information, to the system 600. The input device and interface may be any of a number of common interface devices, such as a joystick, a touch-pad, a touch-screen, a speech-recognition device, or other known input device. Any such components or devices may use control device/OTS drivers with or without nonvolatile memory devices in accordance with the principles of the present invention. In some embodiments of a system in accordance with the principles of the present invention, the adapter 690 may operate with transceiver 673 and antenna 675 to provide wireless communications, for example, in cellular telephone, RFID, and wifi computer implementations. Any such components or devices may use control device/OTS drivers with or without nonvolatile memory devices in accordance with the principles of the present invention.

Operation of system 600 is generally controlled and coordinated by operating system software. The operating system controls allocation of system resources and performs tasks such as processing scheduling, memory management, networking, and I/O services, among things. In particular, an operating system resident in system memory and running on CPU 605 coordinates the operation of the other elements of the system 600. In illustrative handheld electronic device embodiments of a system 600 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 655, keyboard 656 and mouse 657, for example. Embodiments with a transmitter, recording capability, etc., may also include a microphone input (not shown).

In an illustrative RFID transponder implementation of a system 600 in accordance with the principles of the present invention, the antenna 675 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 673 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 673 as an "answerback" signal on the antenna 675 at a second carrier frequency $F_2$. In passive RFID systems power is derived from the interrogating signal and memory such as provided by a chalcogenide-based control device/OTS driver with or without nonvolatile memory in accordance with the principles of the present invention is particularly well suited to such use.

We claim:

1. An apparatus, comprising:
   an ovonic threshold switch; and
   a control device configured to trigger the ovonic threshold switch, the ovonic threshold switch configured to drive a load in parallel with the control device.

2. The apparatus of claim 1 wherein the control device is configured to turn off after the ovonic threshold switch is triggered.

3. The apparatus of claim 1 wherein the ovonic threshold switch is configured to drive an integrated circuit output.

4. The apparatus of claim 1 wherein the ovonic threshold switch is configured to drive a memory cell.

5. The apparatus of claim 3 wherein the ovonic threshold switch is configured to drive an output of a phase change memory integrated circuit.

6. The apparatus of claim 1 wherein the ovonic threshold switch is configured to drive a load that includes a threshold device.

7. The apparatus of claim 6 wherein the load includes a memory element.

8. The apparatus of claim 7 wherein the ovonic threshold switch is configured to drive a phase change memory cell.

9. The apparatus of claim 8 wherein the phase change memory cell includes an ovonic universal memory cell in combination with an ovonic threshold switch, with the ovonic threshold switch configured to operate as an access device.

10. The apparatus of claim 9 further comprising a second control device/ovonic threshold switch combination configured to drive a phase change memory cell.

11. The apparatus of claim 1 wherein the control device is a field effect transistor.

12. The apparatus of claim 1 wherein the control device is a three terminal ovonic threshold switch.

13. A method, comprising the steps of:
activating a control terminal of a control device; and
the control device triggering an ovonic threshold switch to drive a load in parallel with the control device in response to activation of a control terminal.

14. The method of claim 13 further comprising the step of turning off the control device by deactivating the control terminal after the ovonic threshold switch is triggered.

15. The method of claim 13 further comprising the step of driving an output of an integrated circuit with the triggered ovonic threshold switch.

16. The method of claim 15 wherein the step of driving an output of an integrated circuit includes the step of driving an output of a memory.

17. The method of claim 13 further comprising the step of the ovonic threshold switch driving a load that includes a threshold device.

18. The method of claim 17 wherein the step of driving a load that includes a threshold device includes the step of driving a phase change memory cell.

19. The method of claim 18 further comprising the step of activating a control terminal of a second control device to trigger a second ovonic threshold switch to drive the phase change memory cell.

20. The method of claim 13 wherein the step of activating a control terminal includes activating the gate of a field effect transistor.

21. The method of claim 13 wherein the step of activating a control terminal includes activating the control terminal of a three-terminal ovonic threshold switch.

22. An electronic device, comprising:
an ovonic threshold switch;
a control device configured to trigger the ovonic threshold switch and to thereby drive a load in parallel with the control device; and
a microprocessor configured to initiate turn-on of the control device.

23. The electronic device of claim 22 further comprising a transmitter/receiver configured to transmit data from and receive data for the microprocessor.

24. The electronic device of claim 23 wherein the memory, microprocessor and transmitter/receiver are configured as a cellular telephone.

25. The electronic device of claim 22 wherein the memory, and microprocessor are configured as a handheld entertainment device.

* * * * *